United States Patent [19]

Danner

[11] Patent Number: 5,442,852
[45] Date of Patent: Aug. 22, 1995

[54] METHOD OF FABRICATING SOLDER BALL ARRAY

[75] Inventor: Paul A. Danner, Beaverton, Oreg.

[73] Assignee: Pacific Microelectronics Corporation, Portland, Oreg.

[21] Appl. No.: 143,186

[22] Filed: Oct. 26, 1993

[51] Int. Cl.6 .............................................. H01R 9/06
[52] U.S. Cl. ...................................... 29/843; 29/830; 228/180.21
[58] Field of Search ............... 29/830, 840, 843, 896, 29/825; 228/180, 21

[56] References Cited

U.S. PATENT DOCUMENTS

| 3,719,981 | 3/1973 | Steitz . | |
|---|---|---|---|
| 4,074,342 | 2/1978 | Honn et al. | 29/830 X |
| 4,604,644 | 8/1986 | Beekham et al. . | |
| 4,783,722 | 11/1988 | Osaki et al. . | |
| 4,788,767 | 12/1988 | Desai et al. | 29/830 |
| 4,830,264 | 5/1989 | Britaillou et al. | 228/180.21 |
| 4,897,918 | 2/1990 | Osaki et al. | 29/830 |
| 4,914,814 | 4/1990 | Behun et al. | 29/843 |
| 4,932,883 | 6/1990 | Hsia et al. | 439/66 |
| 5,109,601 | 5/1992 | McBride | 29/846 X |
| 5,133,495 | 7/1992 | Angulas et al. | 228/180.1 |
| 5,155,905 | 10/1992 | Miller, Jr. | 29/843 |
| 5,162,257 | 11/1992 | Yung | 29/825 X |
| 5,203,075 | 4/1993 | Angulas et al. | 29/830 |
| 5,255,839 | 10/1993 | de costa Alves et al. | 228/180.21 |

OTHER PUBLICATIONS

IBM Technical Disclosure Bulletin vol. 14, No. 9 Feb. 1972 p. 2697.

Primary Examiner—Carl J. Arbes
Attorney, Agent, or Firm—Chernoff, Vilhauer, McClung & Stenzel

[57] ABSTRACT

A method for manufacturing an electronic module comprising a substrate carrying circuitry and one or more integrated circuits and having an array of closely spaced solder balls electrically connected with terminals of the circuitry to connect the module to an array of terminals, as on printed circuit board. The array of solder balls is fabricated on the substrate by preparing the substrate to include an array of terminal pads, perforating a sheet of dielectric tape to create precise and uniform holes, and thereafter fusing the tape onto the substrate so that the holes are aligned over the substrate's terminal pads. Solder balls are then placed in the holes and heated to reflow them, so that part of the solder fills a volume defined by the holes in the dielectric tape and bonds to the terminal pads on the substrate, while the solder balls remain generally spherical above the dielectric tape. The module can then be connected to an array of terminal pads on a circuit board by positioning the ball grid array on the circuit board and again reflowing the solder balls so that they bond with the terminal pads on the circuit board.

23 Claims, 3 Drawing Sheets

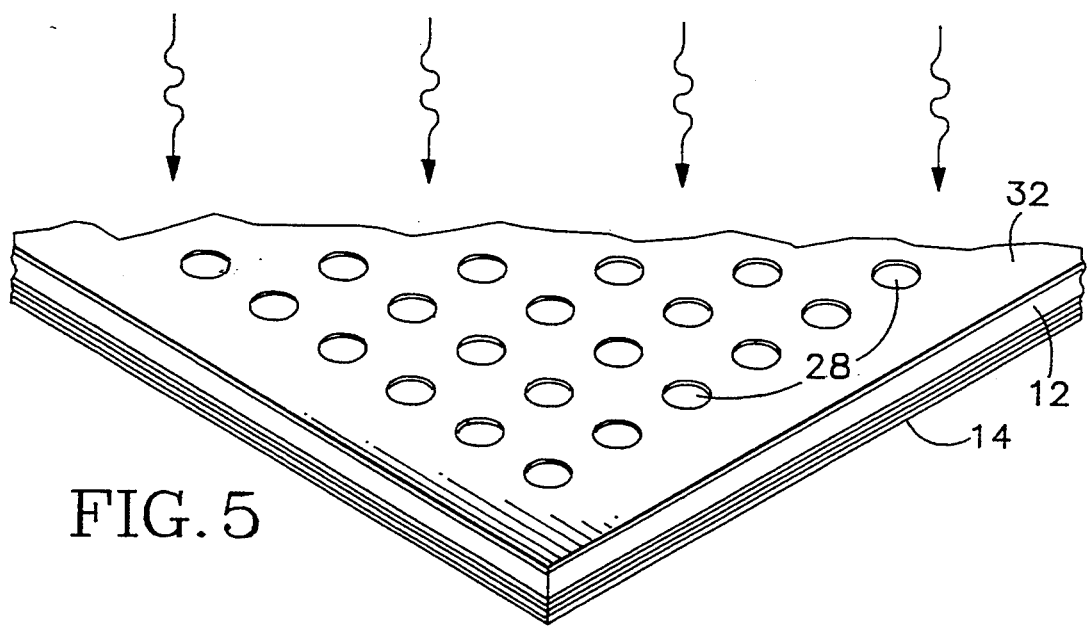
FIG. 5
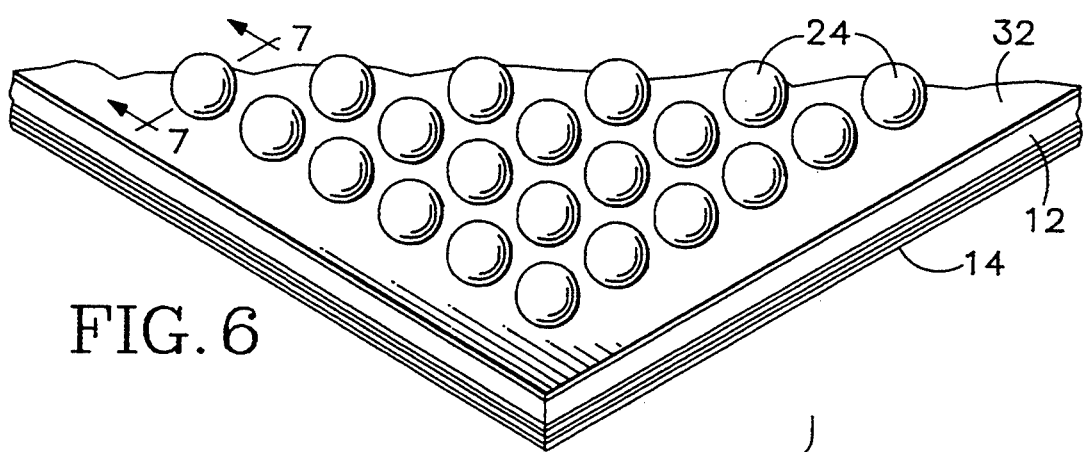
FIG. 6
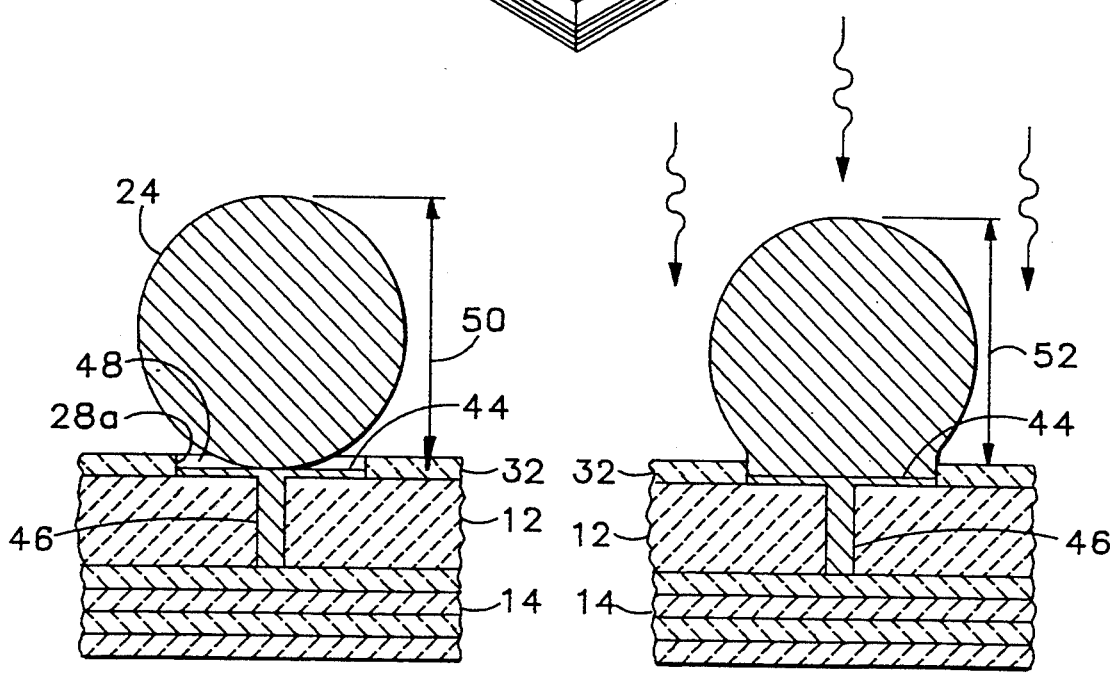
FIG. 7
FIG. 8

METHOD OF FABRICATING SOLDER BALL ARRAY

BACKGROUND OF THE INVENTION

1. Field of the Invention

This invention relates generally to electrical interconnections between a ceramic substrate an a supporting circuit board and ore particularly to a method of forming a ball grid array o conductors on the ceramic substrate and to a product formed thereby.

2. Related Art

In microelectronic applications (e.g., for electronic circuit packages which may include one or more integrated circuits), solder bonds are commonly used to attach the package to a substrate such as a printed circuit board. In one technique, an electronic package is connected to a printed circuit board, both electrically and thermally, by the used of multiple solder balls in an array. The package is placed in registration with the printed circuit board and heated until the solder balls of such an array flow and collapse to a limited degree to effect connection to terminals on the printed circuit board or other substrate.

The use of solder ball electrical connectors is shown in Steitz, U.S. Pat. No. 3,719,981, where solder balls are shown attached to low profile solder bumps to provide a workable configuration for connection to a printed circuit board. Steitz uses a tacky, pressure sensitive tape for maintaining an alignment of the solder balls until they are positioned into wells within as mask and onto the solder bumps and reflowed. However, the process in Steitz is lengthy, involving many steps, and does not provide adequate control over the ultimate size of the solder balls, which is critical to making reliable connections, particularly where there is a high density of solder balls.

Angulas, et al., U.S. Pat. No. 5,203,075, discloses formation of interconnections between circuit-carrying substrates by heating solder paste deposits, causing the solder to melt and ball up around a solder ball attached to a circuit-carrying substrate opposite the one on which the deposit of solder paste is located. Angulas, et al., however, requires the solder balls to be arranged in a template from which they are transferred to the circuit-carrying substrate.

Angulas, et al., U.S. Pat. No. 5,133,495, discloses a method of forming solder balls in an array on a circuit substrate by heating deposits of solder paste surrounded by organic dewetting material so that the solder paste forms balls electrically connected with conductors located beneath the deposits of solder paste. This method, however, requires very precise control over the deposition of the solder paste and an underlying deposit of anti-wetting material to produce an array of solder balls of uniform size.

Thus, in the past it has been difficult to construct an array of substantially similar-sized spherical balls of solder protruding from an area of an integrated circuit package for use in mounting and connecting such a package on a printed circuit or similar substrate. What is still needed, then, is an improved method for producing an array of solder balls attached to a substrate of an electronic circuit package so that the balls are of uniform height, as well as an electronic circuit package including such an array of solder balls closely spaced together, accurately located, and of uniform height, so that the solder balls can all be connected reliably to an array of circuit terminals.

SUMMARY OF THE INVENTION

The present invention provides a method of fabricating a high density array of solder balls on a substrate while also providing very precise control of the location and ultimate size of the arrayed balls. The present method is also easier to perform than previously known methods, involving fewer steps and drawing from conventional thick film fabrication techniques. The method according to the invention includes the step of precisely perforating a thin sheet of dielectric material to create a grid of holes to match a grid of terminal pads located on the substrate. The perforated sheet is then attached to the substrate, exposing a respective terminal pad in each of the holes. Thereafter, spherical solder balls of uniform size are placed in the holes in the sheet, and the combination is heated until the balls reflow to fill the holes and bond with the terminal pads on the substrate. Surface tension maintains the generally spherical shape of the solder balls while they are reflowing.

The substrate with the ball grid array thus formed is then ready for mounting onto a circuit board by positioning the substrate with its ball grid array facing an array of electric contacts or terminal pads on the circuit board similar to the ball grid array on the substrate. The ball grid array is heated to reflow the solder balls again to make connection with the electrical contacts on the circuit board.

In a preferred embodiment of the invention the sheet of dielectric material is in a form commonly called an overlay tape, including a layer of a mixture of glass frit, powdered alumina, and an adhesive organic binder, all carried on a thin carrier film of plastic material. The holes are defined in a precise array, for example, by computer controlled laser machining techniques, and the tape is attached to a ceramic substrate by first laminating it to the substrate by a combination of heat and pressure. The carrier film is then removed from the tape, after which the tape and substrate are heated to burn off the organic materials in the tape, leaving a glass frit and alumina layer on the substrate. The glass frit and alumina are then fired at a temperature high enough that the glass frit fuses, securing a thin dielectric layer on the surface of the substrate with precisely defined holes exposing the terminal pads on the substrate.

The present invention also provides such a ball grid array formed on a ceramic substrate by the method described wherein solder balls, having a diameter larger than the holes in the dielectric tape, are located within the holes and bonded to the terminal pads.

The foregoing and other objectives, features, and advantages of the invention will be more readily understood upon consideration of the following detailed description of the invention, taken in conjunction with the accompanying drawings.

BRIEF DESCRIPTION OF THE DRAWINGS

FIG. 5 is a perspective view of a portion of the substrate and dielectric material shown in FIG. 4 after the carrier film has been removed and while the sheet of dielectric material is being fused to the substrate.

FIG. 6 is a perspective view of similar to FIG. 5 showing solder balls resting in the holes in the sheet of dielectric material.

FIG. 7 is a sectional view taken along line 7—7 in FIG. 6, showing a solder ball resting within a hole in the sheet of dielectric material and on top of a terminal pad located in the substrate.

FIG. 8 is a sectional view similar to FIG. 7 showing a solder ball after reflow during which solder has filled a hole in the sheet of dielectric material and bonded with a terminal pad located on the substrate.

DETAILED DESCRIPTION OF A PREFERRED EMBODIMENT

Figure 1:
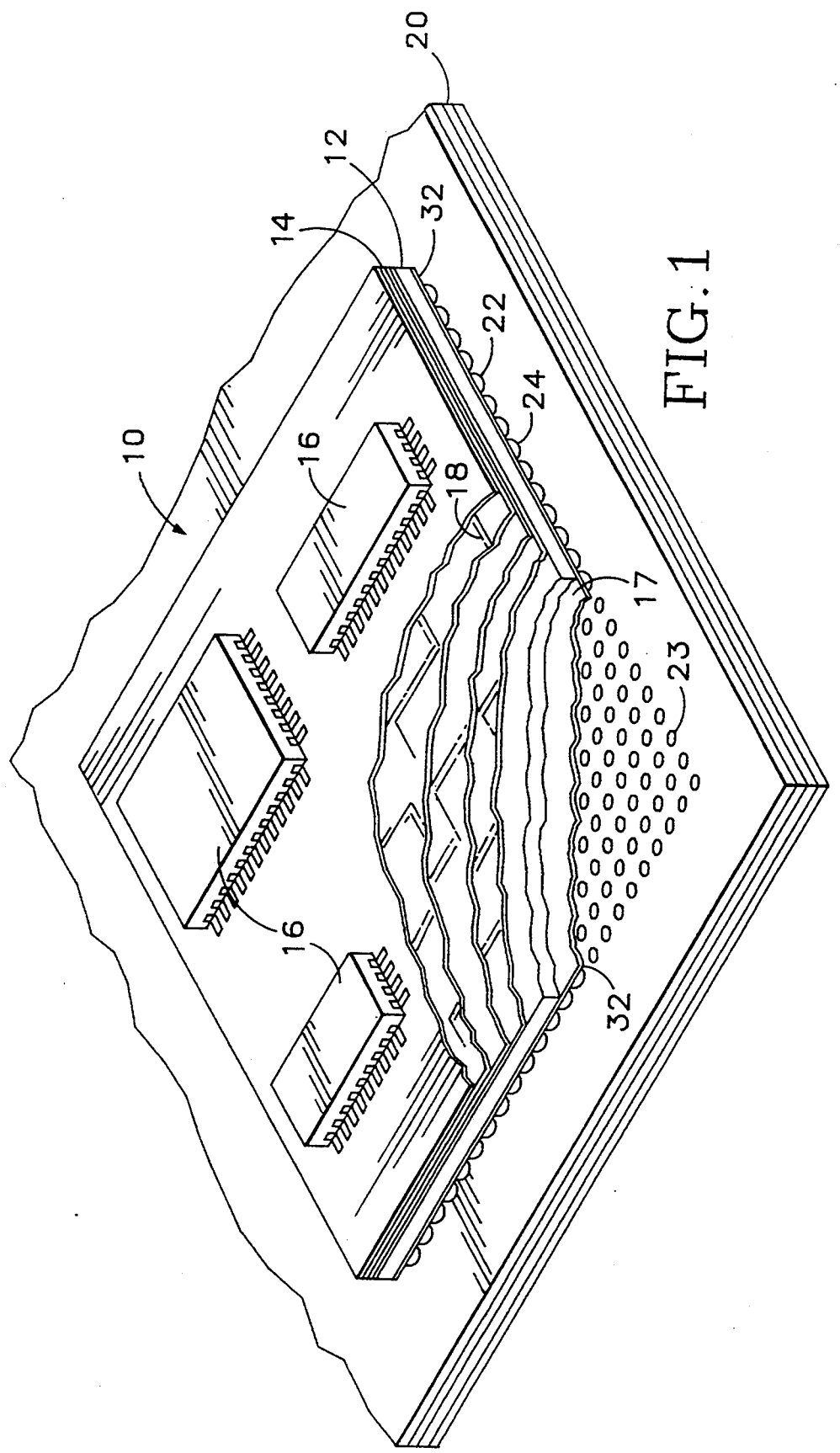
FIG. 1 is a perspective view of a multi-chip electronic circuit module including a ball grid array according to the present invention and connected to a circuit board thereby.

A multi-chip module 10, shown in FIG. 1, comprises a substrate 12 having a plurality of dielectric tape overlays 14 (four overlays are shown) mounted onto a top surface 17 of the substrate 12. Three integrated circuits (ICs) 16 are mounted on the uppermost overlay 14, although fewer or more ICs 16 or overlays 14 might be used in a particular module. Among the dielectric overlays 14, circuits are formed to provide electric pathways between the ICs 16 and the substrate 12. On a bottom surface 19 the substrate 12 has a rectangular grid array of terminal pads 44 (shown in FIG. 7) that are electrically interconnected with the circuits in the overlays 14 by means of vias 46 (FIGS. 7 and 8). The multi-chip module 10 is shown mounted on a circuit board 20 which may be a printed circuit board, and is electrically connected to the circuit board 20 by means of a ball grid array 22 that is formed on the bottom surface 19 of the substrate 12 as described herein. Multi-chip module substrates 12 may be ceramic, polymer, or other suitable materials; in the preferred embodiment of the invention the substrate 12 is ceramic.

Dielectric tape overlays 14 including ceramic materials are used in common fabrication techniques for making thick film circuit devices and do not form a part of this invention. However, it is important to note that such dielectric tape is applied to the substrate 12 in an unfired state in which the dielectric material comprises organic and inorganic materials mounted on a carrier film. Dielectric overlays incorporating ceramics and fusible inorganic materials are applied to a substrate using a combination of pressure and heat and eventually are fired at a high temperature in order to burn or evaporate out the organic materials and fuse the remaining inorganic materials to form a ceramic layer having a circuit pattern thereon.

Among the suitable types of dielectric materials for such overlays on a ceramic substrate 12 are ceramic tapes known as "transfer" tape and "co-fire" tape. Transfer tapes such as that available from Electro-Science Laboratories, Inc. of King of Prussia, Pa., under the designation D-101-TT, must be applied individually to a substrate and each layer must be fired before a succeeding layer of dielectric tape may be applied. A co-fire tape, such as one also available from Electro-Science Laboratories, Inc., under the designation D-101-CT, allows stacking and firing of several green tape layers together as a set.

Due to the large numbers of electrical leads emerging from many ICs, a multi-chip module 10 may need several hundred connectors to conduct electrical signals from the module 10 to a circuit board 20 or another other circuit module. The present invention provides a method for fabricating such a high number of electrical connectors as a high density grid array 22 of solder ball conductors attached to the bottom surface 19 of the substrate 12.

After the ICs 16 have been mounted onto the module 10 and the ball grid array 22 has been fabricated on the substrate 12, the module may be positioned onto a printed circuit board 20 having an array of terminal pads 23. The assembly is heated to cause the solder balls 24 of the ball grid array 22 to reflow and bond with the terminal pads 23 on the circuit board. The assembly is then allowed to cool leaving the solder balls 24 firmly bonded with the terminal pads 23 on the circuit board 20, to act both as electrical conductors and conductors of heat from the module 10.

The bottom 19 of the substrate 12 is then parallel with but separated from the circuit board 20 by a small space which permits use of cleaning fluids between the substrate and circuit board to remove flux and stray solder. The solder of the balls conducts heat well and the space between the substrate and the circuit board permits air flow, thus helping to cool the solder balls. It has also been found to be advantageous to put a heat sink on the other side of the circuit board 20, opposite the multi-chip module 10, in order to dissipate heat from the multi-chip module.

According to the invention, the ball grid array 22 is fabricated on the bottom surface 19 of the substrate 12 of an electronic module such as the multi-chip module 10 by mounting a sheet of dielectric tape 32, having a plurality of precisely formed holes 28, onto the substrate 12. Precisely-sized spherical solder balls 24 are then placed into the holes, and the assembly is heated until the solder balls reflow, filling the holes and forming a mechanical and electrical bond with the terminal pads 44 on the substrate, yet still standing above the dielectric tape 32 in a substantially spherical shape.

Figure 2:
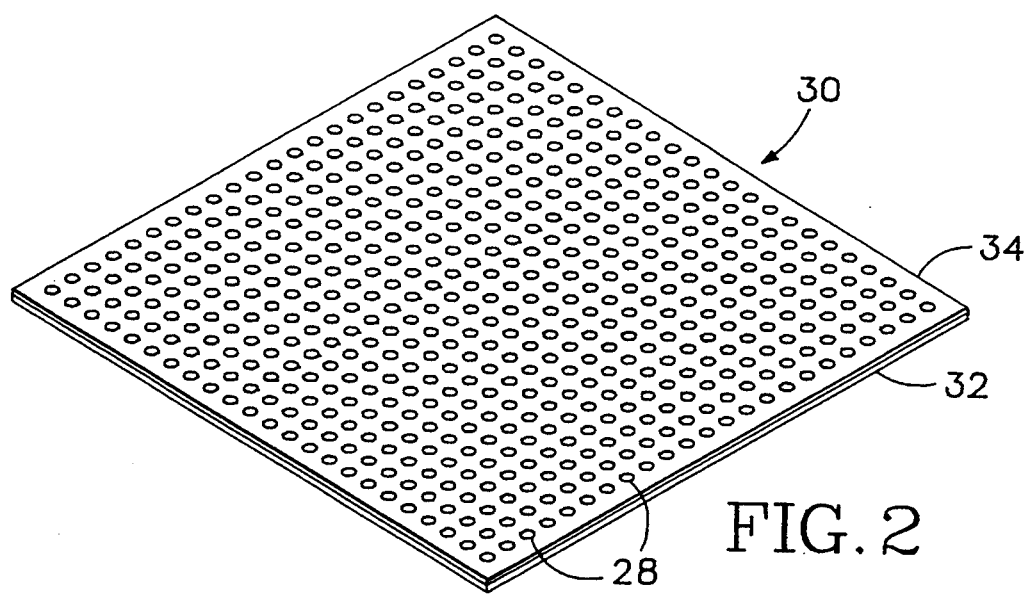
FIG. 2 is a perspective view of a sheet of dielectric material mounted on a carrier film, for use in constructing a ball grid array in accordance with the present invention.

FIG. 2 shows a sheet 30 comprising a carrier film 34 and a dielectric tape 32 that have been perforated to create an array of holes 28. Preferably, for a module 10 incorporating a ceramic substrate, the tape 32 is a transfer tape or co-fire tape as described above, but may also be any other fusible dielectric ceramic material in sheet form that can be suitably perforated and cut. The tape 32 of the preferred embodiment comprises inorganic materials, such as glass frit and alumina, suspended in an organic binder and is mounted on a carrier film 34, of a plastic material such as polypropylene, for care of handling. The tape is perforated when in its unfired state, that is, before it is densified and fired. In its unfired state the sheet 30 is somewhat flexible and readily cut so as to accept sizing and perforating.

The sheet of dielectric material may be perforated by any means by which closely-spaced holes of precise size can be formed, including the use of a mechanical punch. In the preferred manner of carrying out the method of the invention, however, the sheet 30 is perforated using a computer controlled laser for precise and accurate location and size of the holes 28. For example, a $CO_2$ laser of the type used in and controlled in the manner well known in cutting ceramic substrates in the hybrid microelectronics industry has been found to be satisfactory. It is important to this fabrication process that the holes 28 have precisely identical diameters, for reasons that will be explained below.

Figure 3:
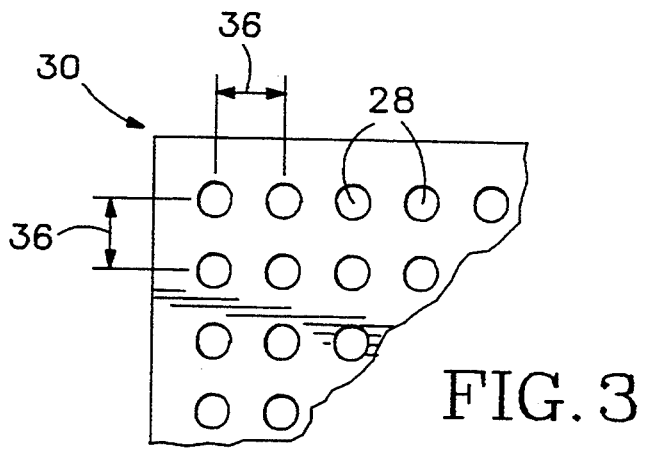
FIG. 3 is a plan view at an enlarged scale of a part of the sheet of dielectric material shown in FIG. 2, showing holes arranged in a rectangular array.

FIG. 3 shows a preferred arrangement wherein the holes 28 are aligned in a rectangular grid of rows and columns of holes separated by a pitch 36. In a preferred embodiment of the present invention the ball grid array has been made in the rectangular grid pattern having a pitch 36 as small as 0.050 inch (1.25 mm) with solder balls having an initial diameter of 0.030 inch (0.76 mm). Smaller pitches can be expected as improvements are made in the manufacturing process. When the regular grid array of the invention is formed on a 32×32 mm substrate with a pitch 36 of 1.25 mm, there are 529 holes 28.

Figure 4:
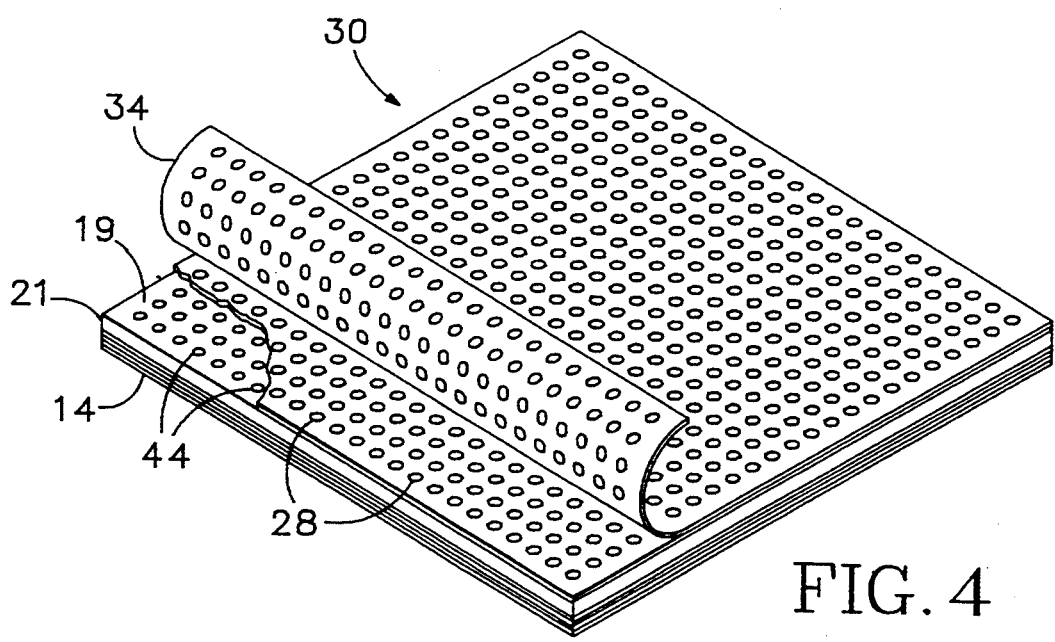
FIG. 4 is a perspective view of one step in the method of preparing a ball array according to the present invention showing a substrate and a partially cut-away section of the sheet of dielectric material, with the carrier film partially peeled back.

After the sheet 30 of dielectric overlay tape has been perforated it is laminated to the substrate 12 as shown in FIG. 4. The tape, still in its green state, is placed on the bottom surface 19 of the substrate 12 with the holes 28 aligned with terminal pads 23 that have been formed on the substrate, for example, as photoresist etched deposits of conductive material a few microns thick. Registration holes (not shown) may be marked and cut in the dielectric tape 30 and aligned over target areas (not shown) marked on the substrate 12 using well known methods to ensure precise and accurate location of the tape on the substrate. After the tape 30 is properly located on the substrate 12 it is adhesively laminated to the substrate by applying pressure and heat. For example, the previously mentioned D-101-TT transfer tape can be laminated to the substrate 12 using a pressure of 800 pounds per square inch at 70° C. for three minutes. However, the precise pressure and temperature schedule is dependent on the tape used, and manufacturer's specifications for alternate tapes may call for a different schedule. After lamination the carrier film 34 is removed leaving only the dielectric tape 32 on the substrate 12.

The next step in the fabrication of the ball grid array is densification of the dielectric tape 32, as shown in FIG. 5. By heating the assembly to a higher temperature after lamination of the tape to the substrate the organic binder is burned or evaporated out of the tape leaving only a layer of inorganic materials on the substrate. As with the lamination process, the optimum burn out temperatures and times depend on many factors, and guidance is usually available from the manufacturer of the dielectric tape. For the co-fire dielectric tape specified above, D-101-CT, the manufacturer recommends burn out temperatures between 200° and 450° C. with hold times at 400° C. for 15 minutes to 20 hours, depending on part size and gas removal capability. The process of densification reduces the thickness of the tape while leaving unchanged the dimensions parallel to the plane of the substrate 12.

After densification, the substrate and tape 32 are fired at a higher temperature to fuse the glass frit and thus integrate the tape 32 and unite it firmly with the substrate 12. As with the step of densification, the firing temperature and time are dependent on many factors and the manufacturer's recommendations can be followed. For the tapes described above, D-101-TT and D-101-CT, the preferred firing temperature is approximately 850° C.

During the densification and firing phases of the process, the thickness of the tape 32 can shrink as much as 40%. However, due to the properties of the tape 32 there is no shrinkage along its length or width. Thus, the precise diameter and location of the holes 28 is maintained throughout the process of fusing the tape 32 to the substrate 12 and the holes 28 remain in precise alignment over the terminal pads 44.

With reference to FIG. 7, it can be seen that a hole 28 and terminal pad 44 define a cylindrical volume 48 bounded by the terminal pad at the bottom end and by the circular interior wall of the hole 28. It is important to a preferred embodiment of the ball grid array 22 that the volume 48 of all the holes be precisely similar, so that uniform solder balls 24 will provide an array of attached solder balls of equal height.

After the step of firing to integrate the tape with the substrate 12 the assembly is cooled. A spherical solder ball 24 is then placed in each hole 28, where it rests on a terminal pad 44. The solder balls 24 are preferably placed on the array of holes 28 mechanically, as by a vacuum carrier (not shown) including a similar array of pickup nozzles, and the holes 28 will each catch one of the balls 24 and somewhat sticky flux, if present, will help retain the balls 24 In a preferred embodiment of the invention the balls have a diameter of approximately 0.030 inches (0.076 mm). The post shrinkage thickness of the tape 32 is preferably approximately 0.0025 inches (0.006 mm), while the holes 28 are circular, with a diameter of 0.022 inch (0.056 mm), although a diameter of 0.018 to 0.025 inch has been found to be satisfactory with a ball diameter of 0.030 inch. After the balls have been placed in the holes and are resting on the terminal pads 44 the device is reheated in order to reflow the solder balls 24 so that solder completely fills the volume 48 and bonds with the terminal pad 44 to create a mechanical and an electrical connection thereto. Surface tension on the solder maintains the generally spherical shape of the solder balls 24 during reflow and while they cool. Because part of the solder ball 24 flows to fill the volume 48, the ball shrinks from its initial diameter 50 of approximately 0.030 to a height 52 above the tape 32 of approximately 0.024 inch (0.061 mm) in the preferred embodiment. Thus, it is important that the hole diameters, and therefore the volumes 48, be precise relative to one another so that after reflow the height 52 of all of the solder balls 24 is kept equal. This uniformity is important for accurate and reliable connection of the ball grid array 22 to terminals on a printed circuit board 20 or other module.

Several compositions of solder are suitable for use as solder balls in the present invention, but preferred embodiments use balls of Sn 10 or Sn 62 solder, depending on the temperature to which a circuit to which a module 10 is connected by the ball grid array may later be subjected. Sn 10 is a solder composition comprising 10% tin, 2% silver, and 88% lead, and has a reflow point at approximately 325° C. Sn 62 is a solder comprising 62% tin, 2% silver and 36% lead, having a 220° C. reflow point.

The terms and expressions which have been employed in the foregoing specification are used therein as terms of description and not of limitation, and there is no intention, in the use of such terms and expressions, of excluding equivalents of the features shown and described or portions thereof, it being recognized that the scope of the invention is defined and limited only by the claims which follow.

What is claimed is:

1. A method of fabricating a ball grid array on a substrate having a plurality of electrical terminal pads thereon, comprising:
   (a) perforating a sheet of dielectric material to create a plurality of holes therethrough;
   (b) fastening the sheet of dielectric material to the substrate so that two or more of the holes are positioned over two or more of the pads;
   (c) placing solder balls into the holes that are positioned over the pads; and
   (d) heating the balls until the balls reflow and bond to the pads, each solder ball being large enough that it retains a spherical surface protruding above said sheet of dielectric material when bonded to a respective pad.

2. The method of claim 1, including placing each ball into a respective hole so that it is in contact with and supported by a respective terminal pad.

3. The method of claim 1 wherein said step of heating comprises using surface tension to maintain the solder balls in a generally spherical shape.

4. The method of claim 3, comprising the further step of using surface tension to maintain the solder balls in a generally spherical shape while cooling them.

5. The method of claim 1, including the step of using a computer controlled laser to perform said step of perforating said sheet of dielectric material.

6. The method of claim 1, including the step of using a mechanical punch to perform said step of perforating said sheet of dielectric material.

7. The method of claim 1 wherein the sheet of dielectric material comprises inorganic materials in an organic binder on a carrier film and said step of fastening comprises:
   (a) laminating the sheet of dielectric material to the substrate by positioning two or more holes over two or more pads and pressing the sheet of dielectric material against the substrate and heating the sheet of dielectric material and substrate to a first temperature;
   (b) densifying the sheet of dielectric material by heating the sheet of dielectric material and the substrate to a second temperature to remove the organic binder; and
   (c) firing the sheet of dielectric material and the substrate to a third temperature, causing a part of the sheet of dielectric material to fuse and adhere to the substrate.

8. The method of claim 7, further comprising the step of removing the carrier film before densifying the sheet of dielectric material.

9. The method of claim 7 wherein the second temperature is greater than the first temperature.

10. The method of claim 7 wherein the third temperature is greater than the second temperature.

11. A method of fabricating a ball grid array on a substrate having a plurality of terminal pads thereon, said method comprising:
   (a) perforating a sheet of dielectric material substantially free of conductive material carried thereon to create a plurality of holes therethrough, each hole having a first diameter and an interior wall;
   (b) fastening the sheet of dielectric material to the substrate so that two or more of the holes are positioned over respective ones of the terminal pads thus creating a plurality of open volumes each bounded by one of said terminal pads and one of said interior walls;
   (c) placing solder balls, each having a ball diameter greater than said first diameter, into the holes that are positioned over said respective ones of said terminal pads; and
   (d) heating the balls until each ball reflows and substantially fills the respective volume and bonds to the respective terminal pads.

12. The method of claim 11 wherein said step of heating said solder balls includes using surface tension to maintain said solder balls in a generally spherical shape.

13. The method of claim 12, including the further step of using surface tension to maintain the solder balls in a generally spherical shape while cooling them.

14. The method of claim 11, including the step of using a computer controlled laser to perform said step of perforating said sheet of dielectric material.

15. The method of claim 11, including the step of using a mechanical punch to perform said step of perforating said sheet of dielectric material.

16. The method of claim 11 wherein the sheet of dielectric material comprises inorganic materials in an organic binder on a carrier film and said step of fastening comprises:
   (a) laminating the sheet of dielectric material to the substrate by positioning two or more holes over two or more pads, pressing the sheet of dielectric material against the substrate, and heating the sheet of dielectric material and the substrate to a first temperature;
   (b) densifying the sheet of dielectric material by heating the sheet of dielectric material and the substrate to a second temperature to remove the organic binder; and
   (c) firing the sheet of dielectric material and the substrate to a third temperature, causing a part of the sheet of dielectric material to fuse and adhere to the substrate.

17. The method of claim 1 wherein the sheet of dielectric material is substantially free of conductive material adjacent each of said holes.

18. The method of claim 1, wherein said step of perforating includes perforating holes of substantially uniform size and wherein said solder balls are of substantially uniform size.

19. A method of fabricating a ball grid array on a substrate having a plurality of electrical terminal pads thereon, comprising:
   (a) perforating a sheet to create a plurality of holes therethrough, said sheet comprising inorganic materials in an organic binder on a carrier film;
   (b) fastening the sheet to the substrate so that two or more of the holes are positioned over two or more of the pads, said step of fastening including:
      (i) laminating the sheet to the substrate by positioning two or more holes over two or more pads and pressing the sheet against the substrate and heating the sheet and the substrate to a first temperature;
      (ii) densifying the sheet by heating the sheet and the substrate to a second temperature to remove the organic binder; and
      (iii) firing the sheet and the substrate to a third temperature, causing a part of the sheet to fuse and adhere to the substrate;
   (c) placing solder balls into the holes that are positioned over the pads; and (d) heating the balls until the balls reflow and bond to the pads.

20. The method of claim 19, further comprising the step of removing the carrier film before densifying the sheet.

21. The method of claim 19 wherein the second temperature is greater than the first temperature.

22. The method of claim 19 wherein the third temperature is greater than the second temperature.

23. A method of fabricating a ball grid array on a substrate having a plurality of terminal pads thereon, said method comprising:
   (a) perforating a sheet to create a plurality of holes therethrough, each hole having a first diameter and an interior wall, said sheet comprising inorganic materials in an organic binder on a carrier film;
   (b) fastening the sheet to the substrate so that two or more of the holes are positioned over respective ones of the terminal pads thus creating a plurality of open volumes each bounded by one of said terminal pads and one of said interior walls, said step of fastening including:
      (i) laminating the sheet to the substrate by positioning two or more holes over two or more pads, pressing the sheet against the substrate, and heating the sheet and the substrate to a first temperature;
      (ii) densifying the sheet by heating the sheet and the substrate to a second temperature to remove the organic binder; and
      (iii) firing the sheet and the substrate to a third temperature, causing a part of the sheet to fuse and adhere to the substrate;
   (c) placing solder balls, each having a ball diameter greater than said first diameter, into the holes that are positioned over said respective ones of said terminal pads; and
   (d) heating the balls until each ball reflows and substantially fills the respective volume and bonds to the respective terminal pads.

* * * * *

UNITED STATES PATENT AND TRADEMARK OFFICE
CERTIFICATE OF CORRECTION

PATENT NO. : 5,442,852

DATED : August 22, 1995

INVENTOR(S) : Paul A. Danner

It is certified that error appears in the above-identified patent and that said Letters Patent is hereby corrected as shown below:

Col. 1, Line 9: Delete "an" and insert in place thereof --and--;

Line 10 Delete "ore" and insert in place thereof --more--;

Line 11 Delete "o" and insert in place thereof --of--;

Line 14 Delete "e,g.," and insert in place thereof --e.g.,--;

Line 20 Delete "used" and insert in place thereof --use--;

Line 32 Delete "as" and insert in place thereof --a--.

Col. 3, Line 38 After "interconnected" delete the hyphen.

Col. 5, Line 24 Delete "23" and insert in place thereof --44--.

Col. 6, Line 25 After "24" insert --.--.

Signed and Sealed this

Twenty-seventh Day of February, 1996

Attest:

BRUCE LEHMAN

Attesting Officer      Commissioner of Patents and Trademarks